(12) United States Patent
Sawada et al.

(10) Patent No.: US 7,781,127 B2
(45) Date of Patent: Aug. 24, 2010

(54) MANUFACTURING METHOD OF PATTERN FORMED BODY, AND PHOTOMASK FOR VACUUM-ULTRAVIOLET LIGHT

(75) Inventors: Takashi Sawada, Tokyo (JP); Masafumi Kamada, Tokyo (JP); Kaori Yamashita, Tokyo (JP); Hironori Kobayashi, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 410 days.

(21) Appl. No.: 11/523,813

(22) Filed: Sep. 15, 2006

(65) Prior Publication Data

US 2007/0072093 A1    Mar. 29, 2007

(30) Foreign Application Priority Data

Sep. 16, 2005  (JP) .............................. 2005-269708

(51) Int. Cl.
*G03F 1/00* (2006.01)
(52) U.S. Cl. .............................. 430/5; 430/311; 430/396
(58) Field of Classification Search ...................... 430/5, 430/311, 322, 396
See application file for complete search history.

(56) References Cited

U.S. PATENT DOCUMENTS

2003/0162132 A1*   8/2003   Kobayashi ................... 430/313

FOREIGN PATENT DOCUMENTS

JP    2001-324816    11/2001

OTHER PUBLICATIONS

English Translation of JP2001-324816 (Nov. 22, 2001).*

* cited by examiner

*Primary Examiner*—Mark F Huff
*Assistant Examiner*—Stewart A Fraser
(74) *Attorney, Agent, or Firm*—Ladas & Parry LLP

(57) ABSTRACT

A main object of the present invention is to provide a manufacturing method of a pattern formed body which makes it possible to form property varied patterns having a desired line width, even when plural pattern formed bodies are manufactured. To achieve the object, the invention provides a manufacturing method of pattern formed bodies, comprising: a pattern-forming step of radiating vacuum-ultraviolet light onto a patterning substrate, a surface property of which is varied by the vacuum-ultraviolet light, through a photomask having at least a transparent substrate and a light shielding part to form a pattern formed body having a property varied pattern, in which the surface property of the patterning substrate is varied; and a step of repeating the pattern-forming step to manufacture a plurality of the pattern formed bodies, wherein an interval between the transparent substrate and the patterning substrate upon the pattern-forming step is set into the range of 0.1 μm to 200 μm.

4 Claims, 1 Drawing Sheet

MANUFACTURING METHOD OF PATTERN FORMED BODY, AND PHOTOMASK FOR VACUUM-ULTRAVIOLET LIGHT

BACKGROUND OF THE INVENTION

1. Field of the Invention

The present invention relates to a manufacturing method of a pattern formed body which has a pattern, in which property is varied, in its surface and can be used for various products, such as a color filter; and a photomask for vacuum-ultraviolet light used in the manufacturing method of a pattern formed body.

2. Description of the Related Art

Conventionally, various methods have been suggested as a method for manufacturing a pattern formed body wherein various patterns such as designs, images, characters, and circuits are formed on a substrate. For example, a planographic printing, offset printing, printing method for manufacturing a planographic printing original master using heatmode recording materials can be cited. Further, the following methods are also known as examples of methods for manufacturing a pattern formed body by photolithography: a method of radiating light in a pattern form to a photoresist layer applied on a substrate and developing the photoresist after the radiation to perform etching, and a method of using a material having functionality as a photoresist and radiating light to the photoresist so as to form a target pattern directly.

In manufacturing a highly precise pattern formed body used for a color filter or the like, however, the patterns formed by the above-mentioned printing methods have problems in such as location accuracy to lead difficulty in actual applications thereof. Further, in the photolithography method, it is necessary to use a photoresist and further develop the photoresist with a liquid developer after the resist is exposed to light and then perform etching. Accordingly, there are caused such problems that waste liquid generated needs to be disposed. Additionally, there also arises a problem that when a functional material is used as the photoresist, the material is deteriorated by the alkaline solution or the like that is used for the development.

Thus, there is suggested a manufacturing method of a pattern formed body comprising the steps of arranging a patterning substrate having a substrate and an organic molecule membrane made of an organic material and formed on the substrate so as to be opposed to a photomask, radiating vacuum-ultraviolet light in pattern onto the organic molecule membrane through the photomask to decompose and remove the organic molecule membrane, thereby forming a pattern (see, Japanese Patent Application Laid-Open (JP-A) No. 2001-324816). According to this method, a pattern formed body can easily be manufactured through a simple process without using any developing solution or the like. The formation of the pattern by the vacuum-ultraviolet light is attained by the decomposition and removal of the organic molecule membrane by action of the vacuum-ultraviolet light. In other words, when the radiation of the vacuum-ultraviolet light is performed, oxygen present between the photomask and the organic molecule membrane are excited to generate oxygen atom radicals, and further, molecule bonds of the organic material is cleaved by the vacuum-ultraviolet light so as to cause reaction between the excited oxygen atoms and the cleaved molecules. Consequently, gases such as $O_2$ and $H_2O$ are generated. In this way, the organic molecule membrane can be decomposed and so on. The vacuum-ultraviolet light means light having a wavelength which is shorter than wavelengths of ultraviolet rays and is usually within the wavelength range from 100 to 250 nm.

The reaction between the organic material and the oxygen radicals is caused by oxygen present between the photomask and the organic molecule membrane at the time of the manufacturing the pattern formed body. For this reason, when the distance between the photomask and the organic molecule membrane is small, the shape of the resultant pattern formed body is varied by a merely slight change in the interval between the photomask and the organic molecule membrane since the amount of oxygen present therebetween is small. In the above-mentioned method, the photomask and the patterning substrate are arranged to be near to each other, considering such as an effect of diffraction of vacuum-ultraviolet light. However, it is difficult to arrange the photomask and the patterning substrate so as to have a predetermined interval in the state where the photomask and the substrate are near to each other. Accordingly, there remains a problem that when the above-mentioned method is used to manufacture plural pattern formed bodies, it is difficult to make the pattern shapes of the individual pattern formed bodies same.

SUMMARY OF THE INVENTION

Thus, an object of the invention is to provide a manufacturing method of a pattern formed body making the following possible: a property varied pattern is formed through a simple process; and even when plural pattern formed bodies are manufactured, property varied patterns having a desired regular pattern form are formed.

The present invention provides a manufacturing method of pattern formed bodies, comprising: a pattern-forming step of radiating vacuum-ultraviolet light onto a patterning substrate, a surface property of which is varied by the vacuum-ultraviolet light, through a photomask having at least a transparent substrate and a light shielding part to form a pattern formed body having a property varied pattern, in which the surface property of the patterning substrate is varied; and a step of repeating the pattern-forming step to manufacture a plurality of the pattern formed bodies, wherein an interval between the transparent substrate and the patterning substrate upon the pattern-forming step is set into the range of 0.1 µm to 200 µm.

According to the invention, when each of the pattern-forming steps is performed, the interval between the transparent substrate and the patterning substrate is set into the above-mentioned range; therefore, the amount of oxygen present in the interval can be made sufficiently larger than that of oxygen contributing the formation of the property varied pattern. For this reason, even if the interval between the photomask and the patterning substrate changes somewhat between the individual repeated pattern-forming steps, a variation between the line widths or other dimensions of the formed property varied patterns can be made small. Consequently, the invention makes it possible to manufacture plural pattern formed bodies having property varied patterns formed evenly. Moreover, according to the invention, the amount of oxygen present between the photomask and the patterning substrate can be made sufficient; therefore, the invention has an advantage that the generation efficiency of oxygen atom radicals can be made high and a property varied pattern can be effectively formed in the patterning substrate.

The present invention further provides a photomask for vacuum-ultraviolet light used for forming a property varied pattern, in which a property is varied, in a surface of a patterning substrate by giving an effect of vacuum-ultraviolet light in pattern to the patterning substrate, which is arranged to be opposed to the photomask, wherein the photomask comprises a transparent substrate, a light shielding part formed on the transparent substrate, and a spacer portion for keeping an interval between the patterning substrate and the transparent substrate.

The photomask for vacuum-ultraviolet light of the invention has the spacer portion; therefore, when a pattern formed body is manufactured, a predetermined interval can easily be set between its transparent substrate and patterning substrate. Accordingly, when plural pattern formed bodies are manufactured, the shapes of property varied patterns formed in the individual pattern formed bodies can be made same.

In the invention, the thickness of the spacer portion preferably ranges from 0.1 μm to 200 μm. This makes it possible to make the amount of oxygen present between the photomask for vacuum-ultraviolet light and the patterning substrate sufficient, so that the generation efficiency of oxygen atom radicals can be made high. Thus, a property varied pattern can be formed effectively on the patterning substrate.

According to the invention, even if the interval between the photomask and the patterning substrate changes somewhat between the individual pattern-forming steps, a variation between the line widths or other dimensions of the formed property varied patterns can be made small. Consequently, the invention makes it possible to manufacture plural pattern formed bodies having property varied patterns formed evenly. Moreover, the invention also produces an advantage that a property varied pattern can be effectively formed in a patterning substrate.

DESCRIPTION OF THE PREFERRED EMBODIMENTS

The present invention relates to a manufacturing method of a pattern formed body which has a pattern, in which property is varied, in its surface and can be used for various products, such as a color filter; and a photomask for vacuum-ultraviolet light used in the manufacturing method of a pattern formed body. Hereinafter, each of them will be explained.

A. Manufacturing Method of a Pattern Formed Body

First, a manufacturing method of a pattern formed body of the present invention will be explained. The manufacturing method of pattern formed bodies of the invention, comprising: a pattern-forming step of radiating vacuum-ultraviolet light onto a patterning substrate, a surface property of which is varied by the vacuum-ultraviolet light, through a photomask having at least a transparent substrate and a light shielding part to form a pattern formed body having a property varied pattern, in which the surface property of the patterning substrate is varied; and a step of repeating the pattern-forming step to manufacture a plurality of the pattern formed bodies, wherein an interval between the transparent substrate and the patterning substrate upon the pattern-forming step is set into the range of 0.1 μm to 200 μm.

Figure 1A:
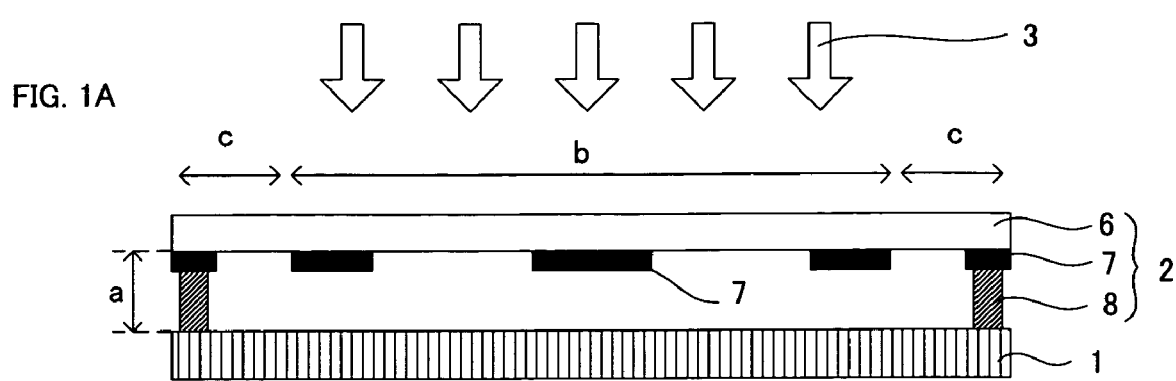
FIGS. 1A and 1B are each a process drawing illustrating an example of the manufacturing method of a pattern formed body according to the invention.
Figure 1B:
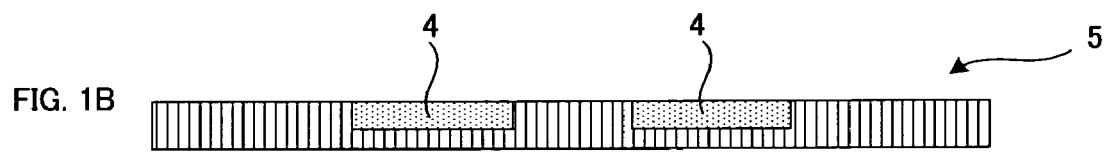

As shown in, for example, FIGS. 1A and 1B, the manufacturing method of a pattern formed body according to the invention is a method having a pattern-forming step of arranging a patterning substrate 1 the surface property of which is varied by vacuum-ultraviolet light and a photomask 2, having a transparent substrate 6 and a light shielding part 7, at an interval so as to render the distance between the patterning substrate 1 and the transparent substrate 6 a predetermined distance "a", and then radiating vacuum-ultraviolet light 3 onto the patterning substrate 1 from the side of the photomask 2 (FIG. 1A); thereby forming a pattern formed body 5 having a property varied pattern 4 in which the surface property of the substrate 1 is varied (FIG. 1B); and repeating this pattern-forming step.

As described above, in the prior art, the formation of a property varied pattern on a patterning substrate is attained by oxygen present between the patterning substrate and an opposed photomask. For this reason, when the distance between the photomask and the patterning substrate is small, the shape of the resultant pattern formed body is varied by a merely slight change in the interval therebetween since the amount of oxygen present therebetween is small. Accordingly, there remains a problem that when plural pattern formed bodies are manufactured, it is difficult to make the pattern shapes of property varied pattern formed in the individual pattern formed bodies even.

On the other hand, in the invention, the interval between the transparent substrate which partially constitutes the photomask and the patterning substrate is set into the above-mentioned range; therefore, the amount of oxygen present in the interval can be made sufficiently larger than that of oxygen contributing to the formation of the property varied pattern. For this reason, even if the interval between the photomask and the patterning substrate changes somewhat between the individual repeated pattern-forming steps, a variation between the line widths or other dimensions of the formed property varied patterns can be made small. Consequently, the invention makes it possible to manufacture plural pattern formed bodies having desired property varied patterns formed evenly.

Moreover, in the invention, at the time of performing each of the pattern-forming steps, oxygen is present in an amount sufficient for forming the property varied pattern between the patterning substrate and the photomask; therefore, the generation efficiency of oxygen atom radicals can be made high. Accordingly, the invention has an advantage that the property varied pattern can be effectively formed in the patterning substrate.

The manufacturing method of a pattern formed body according to the invention will be described in detail hereinafter.

1. Pattern-Forming Step

First, the pattern-forming step in the manufacturing method of a pattern formed body according to the invention is described herein. The pattern-forming step is a step of radiating vacuum-ultraviolet light onto a patterning substrate, the surface property of which is varied by the vacuum-ultraviolet light through a photomask having at least a transparent substrate and a light shielding part, thereby forming a pattern formed body which has a property varied pattern, in which the surface property of the patterning substrate is varied.

In the invention, the interval between the transparent substrate in the photomask and the patterning substrate is set into the range of 0.1 μm to 200 μm. This makes it possible to make the amount of oxygen present between the photomask and the patterning substrate sufficiently larger than that of oxygen contributing to the formation of the property varied pattern.

When the width of lines of the property varied pattern is set into the range of 1 μm to 100 μm in the invention, the interval is set preferably into the range of 0.1 μm to 100 μm, more preferably into the range of 1 μm to 50 μm. When the width of the lines is set into the range of more than 100 μm and 1000 μm or less, the interval is set preferably into the range of 10

μm to 200 μm, more preferably into the range of 50 μm to 200 μm. In this way, effects of diffraction of vacuum-ultraviolet light and others can be made small, so that the highly precise property varied pattern can be made into a desired pattern. When the interval is in the above-mentioned range, for example, a photomask described in item "B. Photomask for vacuum-ultraviolet light", which will be described later, is used to make it possible to keep the intervals in the repeated pattern-forming steps constant.

In the present step, the method for setting the interval between the transparent substrate and the patterning substrate into the above-mentioned range is not particularly limited. The method may be, for example, a method of setting the above-mentioned interval by position-adjusting function of an ordinary exposure device, a method of using a photomask comprising a spacer portion having a height equal to the interval, a method of forming a spacer portion having a height equal to the interval on the patterning substrate, or a method of using a resin film such as a polyimide film, a metal tape such as a SUS tape, spherical particles made of inorganic material, or the like to form a spacer portion separately, and then sandwiching the spacer portion between the transparent substrate and the patterning substrate.

When the spacer portion is formed on the photomask or the patterning substrate, the spacer portion can be arranged in, for example, an area which does not contribute to the formation of the property varied pattern. When the spacer portion is inserted between the transparent substrate and the patterning substrate, the spacer portion can be inserted into a region which does not contribute to the formation of the property varied pattern.

Each of the photomask, the patterning substrate and the method for radiating the vacuum-ultraviolet light, which are each used in the present step, will be described hereinafter.

(1) Photomask

The photomask used in the present step is first described. The photomask is a member having a transparent substrate and a light shielding part formed on the transparent substrate. In the invention, the photomask is not particularly limited as long as the photomask is used when vacuum-ultraviolet light is radiated onto the patterning substrate and makes it possible to form the property varied pattern. Each of the constitutions of the photomask will be described hereinafter.

a. Light Shielding Part

The light shielding part used in the invention is not particularly limited as long as the light shielding part is formed on the transparent substrate which will be detailed later, and does not transmit vacuum-ultraviolet light.

The light shielding part may be, for example, a member produced by forming a thin metal film made of chromium or the like and having a thickness of about 300 to 2000 Å by sputtering, vacuum deposition or the like, and then patterning this film. The method for the patterning may be an ordinary patterning method such as sputtering, metal etching or liftoff.

The method for forming the light shielding part may be, for example, a method of forming a layer wherein light shielding particles made of such as carbon fine particles, a metal oxide, an inorganic pigment, or an organic pigment are incorporated into a resin binder into a pattern form. The thickness of the layer in this case may be arranged in a range of 0.5 μm to 10 μm. Examples of the resin binder to be used may be: a single or mixture made of one or more selected from resins such as polyimide resin, acrylic resin, epoxy resin, polyacrylamide, polyvinyl alcohol, gelatin, casein and cellulose; a photosensitive resin; or an O/W emulsion type resin composition such as a product obtained by emulsifying a reactive silicone. The method for patterning this resin light shielding part may be an ordinarily-used method, such as photolithography or printing.

The light shielding part may be formed on the surface of the photomask which faces the patterning substrate, or may be formed on the surface of the photomask which does not face the patterning substrate when the photomask and the patterning substrate are arranged to be opposed to each other.

The shape of the light shielding part is not particularly limited, and may be appropriately selected in accordance with the shape of the property varied pattern which is to be formed on the patterning substrate.

The width of lines of the light shielding part is set usually to about 0.1 μm or more, preferably to about 1 μm or more. When the width is set into such a range, the property varied pattern can be formed into a desired pattern form without being affected by diffraction of vacuum-ultraviolet light, or the like.

In the invention, the light shielding part may be used as a spacer portion for keeping an interval between the photomask and the patterning substrate. In this case, the thickness of the light shielding part is set to a value equal to the predetermined interval between the transparent substrate and the patterning substrate.

b. Transparent Substrate

The transparent substrate used in the invention is not particularly limited as long as the substrate is a material which has transparency for vacuum-ultraviolet light and which the light shielding part can be formed thereon. The material may be a transparent substrate used in ordinary photomasks. Specific example of such transparent substrate includes non-flexible rigid materials such as a quartz glass plate, a Pyrex (registered trademark) glass and a synthetic quartz plate; and flexible materials, which have flexibility, such as a transparent resin film and an optical resin plate. If necessary, the substrate may be subjected to surface treatment to prevent elution of alkalis, give gas barrier performance, or attain some other purpose.

In order to improve the adhesiveness between the surface of the transparent substrate and the light shielding part, an anchor layer may be formed on the transparent substrate. The anchor layer may be made of, for example, silane or titanium coupling agent.

c. Other Members

If necessary, the photomask used in the invention may have any member other than the light shielding part and the transparent substrate. The photomask may have, for example, a spacer portion as described above.

Such a photomask having a spacer portion will be described later in item "B. Photomask for vacuum-ultraviolet light". Thus, the description thereof is omitted herein.

(2) Patterning Substrate

Next, the patterning substrate used in the present step is described herein. The patterning substrate is not particularly limited about its structure and so forth as long as the patterning substrate is a substrate the surface property of which is varied by vacuum-ultraviolet light.

The patterning substrate may be, for example, a member having a supporting substrate and a property variable layer the surface property of which is varied by irradiation with vacuum-ultraviolet light, or a member made only of a property variable layer the surface property of which is varied by irradiation with vacuum-ultraviolet light.

The kind of the variable property of the property variable layer in the patterning substrate is not particularly limited, and may be, for example, surface wettability variable by irradiation with vacuum-ultraviolet light, adhesiveness to a specified substance variable by irradiation with vacuum-ultraviolet light. Alternatively, the property variable layer may be, for example, a layer which is decomposed and removed by irradiation with vacuum-ultraviolet light, thereby making the supporting substrate expsoed to give a varied property.

In the invention, the property variable layer is preferably a layer the surface wettability of which is varied by irradiation with vacuum-ultraviolet light, more preferably a wettability variable layer the contact angle of which with a liquid is lowered by irradiation with vacuum-ultraviolet light. This makes it possible to render the area where the wettability is varied in the present step a lyophilic area and render the area where the wettability is not varied in the present step a liquid repellent area. Accordingly, when a functional part forming coating solution is coated onto a pattern formed body manufactured by the invention by, for example, a coating method, the functional part forming coating solution can be caused to adhere only to its property varied pattern, which is a lyophilic area. Consequently, a functional part can be made into a highly precise pattern form.

The lyophilic area is defined herein as an area having a lower contact angle with a liquid than that of any area adjacent thereto by 1° or more, and means an area which has a small contact angle with a liquid and has a good wettability to a functional part forming coating solution for forming a functional part. The liquid repellent area means an area which has a large contact angle with a liquid and has a bad wettability to the functional part forming coating solution.

The wettability variable layer used in the patterning substrate preferably has a contact angle of 10° or more with the liquid having a surface tension of 40 mN/m, and more preferably has a contact angle of 10° or more with the liquid having a surface tension of 20 mN/m in the state where the wettability of the layer is not varied for the following reason: the area where the wettability is not varied is an area required to have liquid repellency, and thus if the contact angle of the area with a liquid is small, the liquid repellency thereof is insufficient; therefore, for example, when the functional part forming coating solution is coated onto the pattern formed body, this coating solution may unfavorably remain on the liquid repellent area also.

When vacuum-ultraviolet light is radiated onto the wettability variable layer in the present step, the area where the wettability is varied preferably has a contact angle of 9° or less with the liquid having a surface tension of 40 mN/m, and more preferably has a contact angle of 10° or less with the liquid having a surface tension of 60 mN/m for the following reason: when the contact angle of the area where the wettability is varied (that is, the lyophilic area) with a liquid is high, for example, at the time of coating the functional part forming coating solution, the lyophilic area may also repel this coating solution; thus, a functional part may not be easily patterned on the lyophilic area.

The contact angle with respect to a liquid here is obtained from the results or a graph of the results of measuring (30 seconds after of dropping liquid droplets from a micro syringe) the contact angle with respect to liquids having various surface tensions using a contact angle measuring device (CA-Z type manufactured by Kyowa Interface Science, Co., Ltd). Moreover, at the time of the measurement, as the liquids having the various surface tensions, wetting index standard solution manufactured by JUNSEI CHEMICAL CO., LTD. were used.

This wettability variable layer, in which the wettability is varied by irradiation with vacuum-ultraviolet light, may be, for example, a layer containing an organopolysiloxane, specifically a layer containing an organopolysiloxane as described in Japanese Patent Application Laid-Open No. 2001-074928.

A surfactant, an additive and so forth may be used besides the organopolysiloxane. These may also be, for example, those as described in JP-A No. 2001-074928.

The film thickness of the property variable layer is appropriately selected in accordance with the kind of this layer or kind or usage of the patterning substrate, and is usually from about 0.01 μm to 1 mm, in particular, from about 0.1 μm to 0.1 mm.

When the patterning substrate has a supporting substrate, the supporting substrate is not particularly limited as long as the substrate can support the property variable layer, in which the property is varied. The kind, the flexibility, the transparency and other properties thereof are appropriately selected in accordance with the usage of the pattern formed body, and so on. In the invention, the supporting substrate may be made of an organic material or an inorganic material. Specifically, the substrate may be a resin film, or a glass, ceramic or metal plate, and is preferably a plate-form member.

If necessary, the patterning substrate used in the invention may have various layers or various members. For example, the patterning substrate may have a spacer portion, as described above. The spacer portion may be formed only to keep an interval between the patterning substrate and the photomask. However, for example, a member essential for the pattern formed body may be used as the spacer portion.

(3) Method for Radiating Vacuum-ultraviolet Light

Next, the method for radiating vacuum-ultraviolet light, used in the present step, is described herein. This method is not particularly limited as long as the method is a method making it possible to radiate vacuum-ultraviolet light through the photomask onto the patterning substrate, and may be a radiating method ordinarily used to form a pattern by use of vacuum-ultraviolet light.

The wavelength of the vacuum-ultraviolet light is usually set into the range of 100 nm to 250 nm. The wavelength of the vacuum-ultraviolet light used in the invention is preferably set into the range of 150 nm to 200 nm.

A light source for the vacuum-ultraviolet light may be selected from an excimer lamp, a low-pressure mercury lamp, and other various light sources.

The radiation energy amount of the vacuum-ultraviolet light in the present step is made into a radiation energy amount necessary for varying the property of the surface of the patterning substrate.

The width of the property varied pattern formed in the present step is usually from about 1 μm to 1000 μm, preferably from about 2 μm to 500 μm, more preferably from about 10 μm to 300 μm. In this manner, the property varied pattern can be made into a desired pattern form even if the interval between the photomask and the patterning substrate is set into the above-mentioned range.

2. Other Steps

The manufacturing method of a pattern formed body according to the invention may have some other steps apart from the above-mentioned pattern-forming step if necessary. The method may have, for example, a photomask-forming step of forming the photomask, a patterning substrate forming step of forming the patterning substrate, and an arranging step of arranging the photomask and the pattern formed body to have a predetermined interval therebetween.

B. Photomask for Vacuum-ultraviolet Light

Next, the photomask for vacuum-ultraviolet light according to the invention is described herein. The photomask is a member which is used for forming a property varied pattern, in which a property is varied, in a surface of the patterning substrate, by giving an effect of vacuum-ultraviolet light in pattern to the patterning substrate, which is arranged to be opposed to the photomask, wherein the photomask is characterized by comprising a transparent substrate, a light shielding part formed on the transparent substrate, and a spacer portion for keeping an interval between the patterning substrate and the transparent substrate.

As in, for example, FIG. 1A, the photomask for vacuum-ultraviolet light according to the invention has a transparent substrate 6, a light shielding part 7 formed on the transparent substrate 6, and a spacer portion 8 for keeping an interval between the patterning substrate 1 and the transparent substrate 6.

As described above, the formation of a property varied pattern on a patterning substrate is attained by oxygen present between the patterning substrate and an opposed photomask for vacuum-ultraviolet light. Accordingly, when the distance between the photomask for vacuum-ultraviolet light and the patterning substrate is small, the amount of oxygen present therebetween is small; therefore, there is caused a problem that the shape of a pattern formed body to be formed is varied even if the interval between the photomask for the vacuum-ultraviolet light and the patterning substrate is slightly changed.

However, in the invention, the spacer portion is formed in the photomask, for vacuum-ultraviolet light, which is used in the above-mentioned patterning so that an interval between the photomask for vacuum-ultraviolet light and the patterning substrate can easily be kept into a predetermined value. Accordingly, even when plural pattern formed bodies are manufactured, the shapes of the property varied patterns formed in the individual pattern formed bodies can be made same.

Each of the constituents of the photomask for vacuum-ultraviolet light according to the invention will be described in detail hereinafter.

a. Spacer Portion

The spacer portion used in the photomask for vacuum-ultraviolet light according to the invention is described herein. About the spacer portion, the position where the spacer is formed or any other factor thereof is not particularly limited as long as the spacer portion is a section making it possible to keep an interval between the patterning substrate and the transparent substrate in the photomask for vacuum-ultraviolet light when vacuum-ultraviolet light is radiated thereto. For example, the spacer portion may be formed in a pattern-forming area (represented by b in FIG. 1), which contributes to the formation of a pattern, inside the photomask for vacuum-ultraviolet light, or may be formed in a pattern-non-forming area (represented by c in FIG. 1), which does not contribute to the formation of any pattern. The spacer portion may be formed in both of the pattern-forming area and the pattern-non-forming area.

The "pattern-forming area" means an area which contributes to the formation of a pattern and is composed of an area where the property is varied when an effect of vacuum-ultraviolet light is given to the patterning substrate through the photomask and an area where the property is not varied at this time. The "pattern-non-forming area" means an area which does not produce, when the above-mentioned pattern is formed, any effect onto the shape of the formed pattern.

When the spacer portion is formed inside the pattern-forming area, the spacer portion is usually formed in an area where the light shielding part, which will be detailed later, is formed. In this manner, the spacer portion does not hinder the pattern formation, and further when the photomask for vacuum-ultraviolet light is used, the spacer portion is not deteriorated and the like by vacuum-ultraviolet light. In this case, the light shielding part and the spacer portion may be formed to be integrated with each other, whereby the resultant has both functions of the light shielding part and the spacer portion.

When the spacer portion is formed inside the pattern-non-forming area, it is preferred that the light shielding part, which will be detailed later, is formed in this area, where the spacer portion is formed, or the spacer portion is made of a light shielding material. This makes it possible that at the time of using the photomask for vacuum-ultraviolet light, the spacer portion is not deteriorated and the like by vacuum-ultraviolet light.

The shape of the spacer portion is not particularly limited as long as the shape makes it possible to keep the interval between the photomask for vacuum-ultraviolet light and the patterning substrate into a predetermined value. The shape may be, for example, a columnar shape or any other pillar shape, a frustum shape, or a semispherical shape. The spacer portion may be continuously formed to surround the pattern-forming area in the pattern-non-forming area. The shape of the spacer portion face which contacts the transparent substrate is not particularly limited, and may be any shape, for example, a circular shape, or a rectangular shape. The area of the face on which the spacer portion is formed is not particularly limited as long as the area makes it possible to keep the interval between the photomask for vacuum-ultraviolet light and the patterning substrate into a predetermined value. The area is appropriately selected in accordance with the size of the photomask for vacuum-ultraviolet light or the patterning substrate, the hardness of the spacer portion, or the like.

The thickness of the spacer portion is appropriately selected in accordance with the interval between the photomask and the patterning substrate set when vacuum-ultraviolet light is radiated thereto. For example, when the spacer portion is formed directly on the transparent substrate, the thickness of the spacer portion is made equal to the interval. For example, when the spacer portion and the light shielding part are laminated onto each other, the thickness of the spacer portion is adjusted to make the thickness of the lamination of the spacer portion and the light shielding part equal to the interval.

Usually, the thickness of the spacer portion is preferably set into the range of 0.1 µm to 200 µm. In this manner, the amount of oxygen is made sufficient between the photomask for vacuum-ultraviolet light and the patterning substrate when vacuum-ultraviolet light is radiated thereto. Accordingly, the generation efficiency of oxygen atom radicals can be made high. As a result, a property varied pattern can be effectively formed in the patterning substrate. Furthermore, when the thickness is in the above-mentioned range, the spacer portion can be formed in the state where the thickness thereof can be controlled.

When the width of lines of the property varied pattern is set into the range of 1 µm to 100 µm, the above-mentioned interval is set preferably into the range of 0.1 µm to 100 µm, more preferably in the range of 1 µm to 50 µm. When the line width is set into the range of more than 100 µm to 1000 µm or less, the interval is set preferably into the range of 10 µm to 200 µm, more preferably in the range of 50 µm to 200 µm. In this manner, an effect of diffraction of vacuum-ultraviolet light can be made small. Thus, a desired property varied pattern can be formed with high precision.

The spacer portion may be formed by such as an ordinary photolithographic or printing process. In the invention, the spacer portion is preferably formed by a nozzle jetting-out process. When the spacer portion is formed by the nozzle jetting-out process, it is unnecessary to coat a spacer portion forming coating solution, for forming the spacer portion, onto the whole of a surface of the transparent substrate. It is therefore possible to prevent residues of the spacer portion forming coating solution or others from adhering onto the transparent substrate. Examples of the nozzle jetting-out process include an ink-jetting process, and a coating process using a disperser.

The material used to form the spacer portion may be a photosensitive material used in a columnar spacer in an ordinary liquid crystal display device. Examples of such a material include acrylic resin, polyvinyl alcohol resin, polyacrylamide resin, ethylene/vinyl acetate coplymer, ethylene/vinyl chloride copolymer, ethylene vinyl copolymer, polystyrene, acrylonitrile/styrene copolymer, ABS resin, polymethacrylic acid resin, ethylene methacrylic acid resin, polyvinyl chloride resin, chlorinated polyvinyl chloride, polyvinyl alcohol, cellulose acetate, propionate, cellulose acetate butyrate, nylon 6, nylon 66, nylon 12, polyethylene terephthalate, polybutylene terephthalate, polycarbonate, polyvinyl acetal, polyetheretherketone, polyethersulfone, polyphenylenesulfide, polyarylate, polyvinyl butyral, epoxy resin, phenoxy resin, polyimide resin, polyamideimide resin, polyamic acid resin, polyetherimide resin, phenol resin and urea resin; and a single resin or a mixed resin made from one or more selected from polymers or copolymers each made of one or more selected from methyl acrylate, methyl methacrylate, ethyl acrylate, ethyl methacrylate, n-propyl acrylate, n-propyl methacrylate, isopropyl acrylate, isopropyl methacrylate, sec-butyl acrylate, sec-butyl methacrylate, isobutyl acrylate, isobutyl methacrylate, tert-butyl acrylate, tert-butyl methacrylate, n-pentyl acrylate, n-pentyl methacrylate, n-hexyl acrylate, n-hexyl methacrylate, 2-ethylhexyl acrylate, 2-ethylhexyl methacrylate, n-octyl acrylate, n-octyl methacrylate, n-decyl acrylate, n-decyl methacrylate, styrene, α-methylstyrene, N-vinyl-2-pyrrolidone and glycidyl (meth) acrylate, which are each polymerizable monomer, and one or more selected from acrylic acid, methacrylic acid, a dimer of acrylic acid (for example, M-5600, manufactured by TOAGOSEI Co., Ltd.), itaconic acid, crotonic acid, maleic acid, fumaric acid, acetate vinyl, acid anhydrides thereof, and others. In particular, photosensitive resin compositions comprising such as acrylic and epoxy resins are preferred. Such resins have a small plastic deformation amount to make it possible to keep the interval between the transparent substrate and the patterning substrate into a predetermined range.

In the case where the spacer portion has light shielding property, the above-mentioned material may be a material into which light shielding particles made of such as carbon, a metal oxide, an inorganic pigment, or an organic pigment are incorporated.

b. Light Shielding Part

Next, the light shielding part used in the photomask for vacuum-ultraviolet light according to the invention is described herein. The light shielding part is a part formed on the transparent substrate, which will be detailed later, and is not particularly limited as long as the material does not transmit vacuum-ultraviolet light. For example, the light shielding part may be formed on the side of the photomask for vacuum-ultraviolet light which faces the patterning substrate, or may be formed on the side thereof which does not face the patterning substrate.

The position where the light shielding part is formed is appropriately selected in accordance with the shape of the property varied pattern formed on the patterning substrate, or the like. As described above, when the spacer portion is formed in the pattern-non-forming area of the photomask for vacuum-ultraviolet light, it is preferred that the light shielding part is also formed in this area, where the spacer portion is formed.

The material used to form the light shielding part, the method for forming the light shielding part, the film thickness thereof, and other factors thereof may be the same as described in the sub-item "Light shielding part" in the above-mentioned item "A. Manufacturing method of a pattern formed body". Thus, the description thereof is omitted herein.

c. Transparent Substrate

Next, the transparent substrate used in the photomask for vacuum-ultraviolet light according to the invention is described herein. The transparent substrate is not particularly limited as long as the substrate is a substrate which has transparency for vacuum-ultraviolet light and which the light shielding part can be formed on. The transparent substrate may be a transparent substrate used in ordinary photomasks. Specifically, this light shielding part may be the same as described in the sub-item "Transparent substrate" in the above-mentioned item "A. Manufacturing method of a pattern formed body".

d. Photomask for Vacuum-Ultraviolet Light

The photomask for vacuum-ultraviolet light according to the invention is not particularly limited about the layer structure thereof and other factors thereof as long as the photomask has the above-mentioned transparent substrate, light shielding part and spacer portion. If necessary, for example, between the transparent substrate and the light shielding part, between the transparent substrate and the spacer portion, or between the light shielding part and the spacer portion may be formed an adhesiveness-improving layer for improving the adhesiveness therebetween, or the like.

A method for radiating vacuum-ultraviolet light, using the photomask for vacuum-ultraviolet light according to the invention, a patterning substrate in which a property varied pattern is formed using the photomask for vacuum-ultraviolet light, and others may be the same as described in the item "A. Manufacturing method of a pattern formed body". Thus, the detailed description thereof is omitted herein.

The present invention is not limited to the above-mentioned embodiments. Any modification which has substantially the same structure as these embodiments so as to embody the technical conception recited in the claims of the invention and which produces the same effects and advantages as the embodiments is included in the technical scope of the invention.

For example, the above has described the specific photomask for vacuum-ultraviolet light, which has a transparent substrate, a light shielding part formed on the transparent substrate, and a spacer portion; however, the photomask for vacuum-ultraviolet light can be rendered a photomask which has a transparent substrate and a spacer portion formed on the transparent substrate but does not have any light shielding part. In this case, the spacer portion is formed in the above-mentioned pattern-forming area. Thus, the spacer portion can have both of a function of keeping the interval between the transparent substrate and the patterning substrate, and a function contributing to the formation of a pattern on the patterning substrate. Such a spacer portion may or may not have light shielding property as long as the section is not deteriorated by irradiation with vacuum-ultraviolet light.

EXAMPLES

The invention will be more specifically described by way of the following examples.

Example 1

<Formation of a Patterning Substrate>

At room temperature, 1.5 g of a fluoroalkylsilane (TSL 8233, manufactured by GE Toshiba Silicones), 5.0 g of a tetramethoxysilane (TSL 8114, manufactured by GE Toshiba Silicones), and 3 g of 0.1 N hydrochloric acid were stirred for 24 hours to produce a liquid repellent agent containing fluorine. To 1 g of this liquid repellent agent was added 99 g of isopropanol, and then the solution was stirred at room temperature for 10 minutes. This diluted solution was coated onto a glass substrate with a spin coater (at 700 rpm for 5 seconds) to yield a patterning substrate on which a thin film having liquid repellency was formed.

<Formation of a Photomask for Vacuum-ultraviolet Light>

A spacer portion forming agent (IT-MP5500, manufactured by INCTEC INC.) was coated onto an end portion of a photomask in which a light shielding part was formed on a transparent substrate with a dispenser to form a photomask for vacuum-ultraviolet light having a spacer portion with a height of 1 μm.

<Pattern-Forming Step>

An excimer lamp was used to radiate vacuum-ultraviolet light for 50 seconds through the photomask for vacuum-ultraviolet light, which had a pattern having alternately-arranged lines and spaces each having a width of 30 μm, onto the patterning substrate, which had the thin film having liquid repellency, so as to form a pattern having hydrophilic lines 30 μm in width. This step was continuously and repeatedly carried out for 100 patterning substrates. As a result, a pattern having hydrophilic lines 30 μm in width was formed on each of the 100 patterning substrates.

Example 2

<Formation of a Patterning Substrate>

A patterning substrate in which a thin film having liquid repellency was formed was produced in the same way as in Example 1.

<Pattern-Forming Step>

A polyimide film having a thickness of 10 μm was sandwiched between the patterning substrate and a photomask having a pattern of alternately-arranged lines and spaces each having a width of 160 μm in such a manner that the film was positioned into a pattern-non-forming area. An excimer lamp was used to radiate vacuum-ultraviolet light through the photomask onto the patterning substrate for 40 seconds. As a result, a pattern having hydrophilic lines 160 μm in width was formed. This step was continuously and repeatedly carried out for 100 patterning substrates. As a result, a pattern having hydrophilic lines 160 μm in width was formed on each of the 100 patterning substrates.

Example 3

<Formation of a Patterning Substrate>

A patterning substrate in which a thin film having liquid repellency was formed was produced in the same way as in Example 1.

<Pattern-Forming Step>

Spheric particles of 30 μm size was sandwiched between the patterning substrate and a photomask having a pattern of alternately-arranged lines and spaces each having a width of 100 μm in such a manner that the film was positioned into the pattern-non-forming area. An excimer lamp was used to radiate vacuum-ultraviolet light through the photomask onto the patterning substrate for 40 seconds. As a result, a pattern having hydrophilic lines 100 μm in width was formed. This step was continuously and repeatedly carried out for 100 patterning substrates. As a result, a pattern having hydrophilic lines 100 μm in width was formed on each of the 100 patterning substrates.

Example 4

<Formation of a Patterning Substrate>

A patterning substrate in which a thin film having liquid repellency was formed was produced in the same way as in Example 1.

<Formation of a Photomask for Vacuum-ultraviolet Light>

A spacer portion forming agent (IT-MP5500, manufactured by INCTEC INC.) was coated onto an end portion of a photomask in which a light shielding part was formed on a transparent substrate with a dispenser to form a photomask for vacuum-ultraviolet light having a spacer portion with a height of 0.1 μm.

<Pattern-Forming Step>

An excimer lamp was used to radiate vacuum-ultraviolet light for 60 seconds through the photomask for vacuum-ultraviolet light, which had a pattern having alternately-arranged lines and spaces each having a width of 10 μm, onto the patterning substrate, which had the thin film having liquid repellency, so as to form a pattern having hydrophilic lines 10 μm in width. This step was continuously and repeatedly carried out for 100 patterning substrates. As a result, a pattern having hydrophilic lines 10 μm in width was formed on each of the 100 patterning substrates.

Comparative Example

<Formation of a Patterning Substrate>

A patterning substrate in which a thin film having liquid repellency was formed was produced in the same way as in Example 1.

<Pattern-Forming Step>

The patterning substrate and a photomask having a pattern having alternately-arranged lines and spaces each having a width of 50 μm were compressed to each other at 30 gh/cm$^2$ without forming any interval between the patterning substrate and the photomask. An excimer lamp was used to radiate vacuum-ultraviolet light through the photomask onto the patterning substrate for 80 seconds. As a result, a pattern having hydrophilic lines 50 μm in width was formed. This step was continuously and repeatedly carried out for 100 patterning substrates. As a result, a pattern having hydrophilic lines 80 μm in width was formed on each of 30 out of the 100 patterning substrates. However, such a pattern was unable to be formed on each of 70 out of the patterning substrates.

What is claimed is:

1. A manufacturing method of pattern formed bodies, wherein the method comprises a pattern-forming step of radiating vacuum-ultraviolet light onto a patterning substrate, a surface property of which is varied by the vacuum-ultraviolet light, through a photomask having at least a transparent substrate, a light shielding part formed on the transparent substrate, and a spacer portion for keeping an interval between the patterning substrate and the transparent substrate to form a pattern formed body having a property varied pattern, in which the surface property of the patterning substrate is varied; and the pattern-forming step is repeated to manufacture a plurality of the pattern formed bodies, and wherein the interval between the transparent substrate and the patterning substrate is set into the range of 30 μm to 100 μm and a width of lines of the property varied pattern is set into the range of 1 μm to 100 μm upon the pattern-forming step, and the spacer portion is provided in an area where the light shielding part is formed.

2. A manufacturing method of pattern formed bodies, wherein the method comprises a pattern-forming step of radiating vacuum-ultraviolet light onto a patterning substrate, a surface property of which is varied by the vacuum-ultraviolet light, through a photomask having at least a transparent substrate, a light shielding part formed on the transparent substrate, and a spacer portion for keeping an interval between the patterning substrate and the transparent substrate to form a pattern formed body having a property varied pattern, in which the surface property of the patterning substrate is varied; and the pattern-forming step is repeated to manufacture a plurality of the pattern formed bodies, and wherein an interval between the transparent substrate and the patterning substrate is set into range of 10 μm to 200 μm and a width of the property varied pattern is set into the range of more than 100 μm and 1000 μm or less upon the pattern-forming step, and the spacer portion is provided in an area where the light shielding part is formed.

3. A photomask used for vacuum-ultraviolet light used for forming a property varied pattern, whose width of lines is within the range of 1 μm to 100 μm and in which a property is varied, in a surface of a patterning substrate by giving an effect of vacuum-ultraviolet light in pattern to the patterning substrate, which is arranged to be opposed to the photomask, wherein the photomask comprises a transparent substrate, a light shielding part formed on the transparent substrate, and a spacer for keeping an interval between the patterning substrate and the transparent substrate, and wherein a thickness of the spacer portion is from 30 μm to 100 μm and the spacer portion in an area where the light shielding part is formed.

4. A photomask for vacuum-ultraviolet light used for forming a property varied pattern, whose width of lines is within range of more than 100 μm and 1000 μm or less and in which a property is varied, in a surface of a patterning substrate by giving an effect of vacuum-ultraviolet light in pattern to the patterning substrate, which is arranged to be opposed to the photomask, wherein the photomask comprises a transparent substrate, a light shielding part formed on the transparent substrate, and a spacer portion for keeping an interval between the patterning substrate and the transparent substrate, and wherein a thickness of the spacer portion is from 10 μm to 200 μm and the spacer portion is provided in an area where the light shielding part is formed.

* * * * *